United States Patent [19]

Gessert

[11] 4,428,783

[45] Jan. 31, 1984

[54] PROCESS FOR THE MANUFACTURE OF VERTICAL P-N JUNCTIONS IN THE PULLING OF SILICON FROM A SILICON MELT

[75] Inventor: Cord Gessert, Burghausen, Fed. Rep. of Germany

[73] Assignee: Heliotronic Forschungs-Und Entwicklungsgesellschaft Für Solarzellen-Grundstoffe mbH, Fed. Rep. of Germany

[21] Appl. No.: 330,331

[22] Filed: Dec. 14, 1981

[30] Foreign Application Priority Data

Dec. 29, 1980 [DE] Fed. Rep. of Germany ...... 3049376

[51] Int. Cl.³ .......................................... H01L 21/208
[52] U.S. Cl. ..................................... 148/172; 148/173; 148/187; 29/572; 29/576 E; 156/617 SP
[58] Field of Search ............. 148/171, 187, 172, 173; 29/572, 576 E; 156/617 SP

[56] References Cited

U.S. PATENT DOCUMENTS

| | | | |
|---|---|---|---|
| 2,822,308 | 2/1958 | Hall | 148/173 X |
| 2,852,420 | 9/1958 | Pohl | 148/173 |
| 2,861,905 | 11/1958 | Indig et al. | 148/173 X |
| 2,879,189 | 3/1959 | Shockley | 148/173 |
| 2,950,219 | 8/1960 | Pohl | 148/173 |
| 2,999,776 | 9/1961 | Dorendorf et al. | 148/173 X |
| 3,082,130 | 3/1963 | Runyan | 148/173 X |
| 3,093,520 | 6/1963 | John et al. | 148/173 X |
| 3,192,082 | 6/1965 | Tomono et al. | 148/172 |
| 3,969,746 | 7/1976 | Kendall et al. | 148/175 X |
| 4,155,781 | 5/1979 | Diepers | 148/1.5 X |
| 4,359,487 | 11/1982 | Schneider | 29/572 X |

Primary Examiner—G. Ozaki
Attorney, Agent, or Firm—Allison C. Collard; Thomas M. Galgano

[57] ABSTRACT

The invention makes it possible to manufacture silicon wafers having vertical p-n junctions as the basic material for solar cells. As a result of simultaneously adding certain dopants that act in the silicon crystal as donors and certain dopants that develop acceptor properties and also as a result of measures that result in a periodic change in the crystal growth from a low rate $v_n$ to a high rate $v_n$, p- and n-conductive zones are produced in the silicon, each having a total length of from 5 to 2000 μm.

7 Claims, 21 Drawing Figures

PROCESS FOR THE MANUFACTURE OF VERTICAL P-N JUNCTIONS IN THE PULLING OF SILICON FROM A SILICON MELT

The present invention relates to a process for the manufacture of vertical p-n junctions in the pulling of silicon from a silicon melt.

A prerequisite for the manufacture of solar cells for terrestrial use that can compete with conventional sources of energy is a considerable reduction in the cost of the basic material. A number of ribbon pulling processes have therefore been developed in which silicon is obtained directly in the desired thickness, thus saving on the costly and time-consuming sawing step that is necessary in the manufacture of silicon wafers from rod material.

Such processes are, for example, the EFG process (edge defined film fed growth) and the similar CAST process (capillary action shaping technique) in which a silicon ribbon is pulled, in a manner that defines its shape, from the upper opening of a silicon-filled capillary body ("Low Cost Silicon for Solar Energy Conversion Applications", G. W. Schwuttke et al., IBM J. Res. Develop., Vol. 22, No. 4, July, 1978). These two processes can also be used for pulling polygons which are finally divided into silicon wafers, and processed to form solar cells (Large Area Silicon Sheet via EFG TUBE GROWTH, A. S. Taylor et al., Proceedings of the Fifteenth IEEE Photovoltaic Specialists Conference, Orlando, 1981).

Other ribbon-pulling processes are the WEB process based upon forming a membrane between dendrites (R. G. Seidensticker et al., "Computer Modelling of Dendritic WEB Growth Processes and Characterisation of the Material", Proceedings of the Thirteenth IEEE Photovoltaic Specialists Conference, p. 358, Washington D.C., 1978), the ESP process (edge supported pulling) in which two graphite filaments spaced at the desired width of the ribbon are dipped into the melt together with a seed plate, and the silicon ribbon that crystallizes between the graphite filaments is subsequently pulled from the melt ("Melt Growth of Silicon Sheets by Edge Supported Pulling", T. Ciszek), Electro-Chemical Soc., Springmeeting Symposium on Novel crystallization Technics, St. Louis, Miss. 1980, Proceedings in print), the RTR process (Ribbon to Ribbon) in which a polycrystalline ribbon is recrystallized to form highly crystalline to monocrystalline material by means of laser light or electron beam (R. W. Gurtler et al. "Potential for Improved Silicon Ribbon Growth Through Thermal Environment Control", Proceedings of the International Photovoltaic Solar Energy Conference, p. 145, 1979, Boston, London), the Inverted Stepanow Process (U.S. Pat. No. 4,157,373) in which a ribbon is pulled from a slit in the underside of a vessel filled with liquid silicon and, finally, the process according to DE-OS 29 03 061 in which a silicon ribbon is drawn from a silicon melt along a cooled pulling ramp.

For the manufacture of a solar cell, the wafer-material obtained by the processes mentioned which is p-conductive as a result of the addition of, usually, boron to the melt, is counterdoped superficially by diffusion or ion implantation with, for example, phosphorus, the region that is thereby rendered n-conductive usually extending to a depth of approximately 0.1 to 0.5 $\mu$m, with the formation of the p-n junction to the p-conductive, predominant part of the wafer material. The underside of such a solar cell is provided with a coating of, for example, aluminum/gold to tap the current, whereas the metallic contact area of the upper side has a certain conductive finger pattern so that as little of the surface area as possible is screened from the incidence of light; the upper side is usually provided, in addition, with an anti-reflection coating for optimum utilization of the incident light. Although the thickness of such semiconductor platelets usually varies between 200 and 400 $\mu$m, only some of the incident photons of sunlight contribute to the electrical power that can be obtained. As is known, the absorption of this light energy is accompanied by electron/hole pair formation in the various deep regions of the wafer. The electrons and holes that contribute to the electric current are, however, only those which are formed in a zone beneath the p-n junction, which zone is limited by the diffusion length of the charge carriers, which is of the order of approximately 50 $\mu$m, so that charge carriers produced at a relatively great depth in the wafer especially by light in the infrared region do not contribute to the tappable electric current.

In order to utilize as far as possible the entire incident radiation, U.S. Pat. No. 4,155,781, for example, discloses a material having vertical p-n junctions that consists of monocrystalline semiconductor whiskers that have grown on a substrate of, for example, polycrystalline silicon and are subsequently n- or p-doped and then p- or n-counterdoped, by diffusion, in the region near the surface. For making contact, the whisker surface is then coated with a material that is electrically conductive but transparent. This interesting process, which is more of a theoretical proposal, however, since it has not been demonstrated by any practical embodiment, will hardly meet the requirements of solar cells for terrestrial use, namely, apart from high efficiency, cheapness of manufacture, robustness and resistance to the influence of weather.

Solar cells based on silicon having vertical p-n junctions are also known from U.S. Pat. No. 3,969,746. According to the process described therein, parallel slots are etched in a silicon body using an etching agent, into which a dopant is subsequently introduced, by diffusion, for the purpose of producing a p-n junction, which dopant results in a conductivity opposite to that produced by the dopant already present in the silicon. The top and bottom surface of this silicon body are subsequently provided with contacts in customary manner. Such a process, however, is not only time-consuming and labor-intensive but also costly and, therefore, it can reasonably be used only for concentration plants, in which sunlight concentrated, for example, by Fresnell lenses falls onto the solar cell, as is described, for example, also for solar cell material having vertical p-n junctions produced by etching or sawing operations in the U.S. Pat. No. Re. 30,383 of U.S. Pat. No. 4,110,122.

The problem underlying the present invention was to provide a process for the manufacture of solar cell material based on silicon having vertical p-n junctions, which process builds on the known ribbon- and polygon-pulling processes and, with as few separate processing steps as possible, results in reasonably priced solar cells for wide-scale terrestrial use.

This problem is solved by a process which is characterized in that there are added to the silicon melt both dopants that act as acceptors and dopants that act as donors, of which the effective distribution coefficients $k_{Aeff}(v_h)$ and $k_{Deff}(v_h)$ at a high crystal growth rate $v_h$ and also the effective distribution coefficients $k_{Aeff}(v_n)$ and $k_{Deff}(v_n)$ at a low crystal growth rate $(v_n)$ satisfy the condition:

$$\frac{k_{Aeff}(v_h) \cdot k_{Deff}(v_h)}{k_{Aeff}(v_n) \cdot k_{Deff}(v_n)} > 3 \text{ or } < 0.3$$

wherein, in general, $v_h$ is a crystal growth rate greater than the mean pulling speed and $v_n$ is a crystal growth rate lower than the mean pulling speed and the crystal growth during the ribbon pulling operation varies periodically between a low rate $v_n$ and a high rate $v_h$ so that the total length of each p- and n-conductive zone in the crystallized silicon ribbon or the like is from 5 to 2000 μm.

The mean pulling speed $(v_m)$ in ribbon- and polygon-pulling is usually of the order of from 6 to 120 mm/min. Relative to that speed a low crystal growth rate $v_n$ is at least 6 mm/min below the particular set mean pulling speed and a high crystal growth rate $v_h$ is at least 6 mm/min above it in order to make it possible to satisfy the above condition with regard to the effective distribution coefficient.

An initial assessment of suitable dopant pairs is adequately provided by the distribution coefficients for thermal equilibrium in silicon given in the literature and listed by way of example for a few dopant pairs in the following Table 1, which coefficients should, in any case, differ by more than a power of ten.

TABLE 1

Dopant pairs that can be used for silicon melts from which ribbons having vertical p-n junctions can be pulled.

| dopant pair | $k_D$ | $k_A$ |
|---|---|---|
| Sb/B | 0.023 | 0.8 |
| P/Al | 0.35 | 0.002 |
| As/Al | 0.30 | 0.002 |
| P/Ga | 0.35 | 0.008 |
| As/Ga | 0.3 | 0.008 |
| P/In | 0.35 | $4 \cdot 10^{-4}$ |
| As/In | 0.3 | $4 \cdot 10^{-4}$ |
| P,As/Ga,In | 0.35 | 0.008 |
|  | 0.3 | $4 \cdot 10^{-4}$ |

Although not listed in Table 1, boron/bismuth would also be a suitable dopant pair.

For ribbon- and polygon-pulling according to the invention, however, it is the distribution coefficients dependent on the crystal growth rate that are decisive in the last analysis, which can be estimated with adequate accuracy according to the following equation $$k_{eff}(v) = \frac{k}{k + (1-k)\exp(-v/v_D)} \quad (1)$$

In this equation, v denotes the crystal growth rate, k represents the distribution coefficient in thermal equilibrium, that is $k_A$ or $k_D$, $k_{eff}(v)$ is the effective distribution coefficient at the crystal growth rate v, that is $k_{Aeff}(v)$ or $k_{Deff}(v)$, and $v_D$ is the rate of diffusion that is obtained from the quotient of the diffusion coefficient D and diffusion length L, in the melt, of the doping element concerned.

Table 2 shows the effective distribution coefficients for individual crystal growth rates (both in cm/s and in the unit mm/min customary in pulling) that can be determined by approximation according to the above equation (1) for the elements antimony, boron, phosphorus, aluminum, arsenic, gallium and indium.

Just as the crystal growth during pulling varies periodically from a low to a high rate, so the ratio of the effective distribution coefficients changes periodically. Depending on the concentrations $C_A$ and $C_D$ of the acceptors and donors added to the melt, three regions are produced with the change in the effective distribution coefficients under the following conditions: A positively-conductive zone (p-silicon) is produced during the pulling operation for $$\sum_{i=1}^{n} C_{iA} \cdot k_{iAeff}(v) - \sum_{j=1}^{m} C_{jD} \cdot k_{jDeff}(v) > 0 \quad (2)$$

if n (integer) acceptor elements and m (integer) donor elements form the dopant pair in the melt. For a dopant pair consisting of one donor element and one acceptor element, the above inequality reduces to $$(k_{Aeff}(v)/k_{Deff}(v)) \cdot C_A - C_D > 0 \quad (3)$$

TABLE 2

Crystal growth rates and associated effective distribution coefficients and also distribution coefficients in thermal equilibrium and rates of diffusion.

| | | mm/min | 3 | 6 | 12 | 24 | 30 | 45 | 60 | 90 | 120 | k | $v_D$ cm/s |
|---|---|---|---|---|---|---|---|---|---|---|---|---|---|
| | | v cm/s | 0.005 | 0.01 | 0.02 | 0.04 | 0.05 | 0.075 | 0.01 | 0.15 | 0.2 | | |
| $k_{Deff}$ | Sb | | 0.097 | 0.33 | 0.91 | 1 | 1 | 1 | 1 | 1 | 1 | 0.023 | 0.003 |
| $k_{Aeff}$ | B | | 0.91 | 0.97 | 0.98 | 1 | 1 | 1 | 1 | 1 | 1 | 0.8 | 0.005 |
| $k_{Deff}$ | P | | 0.51 | 0.68 | 0.90 | 0.99 | 1 | 1 | 1 | 1 | 1 | 0.35 | 0.007 |
| $k_{Aeff}$ | In | | 0.0006 | 0.001 | 0.002 | 0.017 | 0.042 | 0.31 | 0.83 | 0.98 | 1 | 0.0004 | 0.01 |
| $k_{Deff}$ | As | | 0.56 | 0.8 | 0.97 | 1 | 1 | 1 | 1 | 1 | 1 | 0.3 | 0.0045 |
| $k_{Aeff}$ | Ga | | 0.017 | 0.036 | 0.15 | 0.80 | 0.94 | 1 | 1 | 1 | 1 | 0.008 | 0.0065 |
| $k_{Aeff}$ | Al | | 0.0032 | 0.005 | 0.014 | 0.099 | 0.23 | 0.78 | 0.98 | 1 | 1 | 0.002 | 0.01 |

A space-charge zone (vertical p-n junction) is formed during the pulling operation under the condition $$\sum_{i=1}^{n} C_{iA} \cdot k_{iDeff}(v) - \sum_{j=1}^{m} C_{jD} \cdot k_{jDeff}(v) = 0 \quad (4)$$

and correspondingly reduces for a dopant pair consisting of one donor element and one acceptor element, to $$(k_{Aeff}(v)/k_{Deff}(v)) \cdot C_A - C_D = 0 \quad (5)$$

A negatively-conductive zone (n-silicon) is produced, on the other hand, under the condition $$\sum_{i=1}^{n} C_{iA} \cdot k_{iAeff}(v) - \sum_{j=1}^{m} C_{jD} \cdot k_{jDeff}(v) < 0 \tag{6}$$

For $m=n=1$ the inequality again correspondingly reduces to $$(k_{Aeff}(v)/k_{Deff}(v)) \cdot C_A - C_D < 0 \tag{7}$$

The periodic change from a low to a high growth rate can be brought about, for example, by a periodic change in the pulling rate or, generally, by a periodic change in the temperature of the melt in the region of the growth front. The latter can be effected, for example, by periodically switching on and off the additional cooling means, periodically increasing and decreasing the flow of coolant, periodically switching on and off the additional heating means, periodically increasing and decreasing the output of the additional heating means and the main heating means, periodically switching on and off, increasing and decreasing or reversing the polarity of a direct current through the boundary layer between the growing crystal and the melt, periodically switching on and off a current to produce pulses, periodically opening and closing a radiation screen, etc.

The measures described by way of example above can be arranged to give a variation in the form of, for example, a periodic rectangular function, a periodic ramp function, a periodic trapezoid function, a periodic triangular function, a periodic impulse function or a periodic sinusoidal function. The effect of these measures on the periodicity of the change in growth rate will not of course have the corners of a rectangular function, etc. owing to the inertia inherent in the system, but will be more like a sinusoidal function. The simplest and, as a rule, most appropriate way of representing the periodic variation is therefore a sine function $$v = v_m + v_a \sin 2\pi f_w \cdot t \tag{8}$$

where $v$ again represents the time-varying crystal growth rate, $v_m$ represents the pulling speed, $v_a$ represents the maximum change in the crystal growth rate (the maximum amplitude), $t$ represents the time and $f_w$ is the frequency of change.

The frequency is obtained from the quotient of the pulling speed and the desired length $l$ of the positive and negative zone $(l=l_p+l_n)$ which, in accordance with the invention, can lie between 5 and 2000 μm.

At a pulling speed of $v_m=0.05$ cm/sec, with a desired total length $l$ of positively and negatively conductive zone of 100 μm there would thus be obtained a required variation frequency of the crystal growth of 5 Hz or 5 $s^{-1}$.

For the specific application of the process according to the invention to the manufacture of the basic material for solar cells, the total length $l$ of positively and negatively conductive zone must lie in the range given by $$0.05 L_d < l < 2 L_d \tag{9}$$

wherein $L_d$ represents the diffusion length of the minority carriers in silicon for solar cells, in order to achieve greater efficiency than with conventional solar cells of the same basic material but with a horizontal p-n junction.

The invention is described in detail below, by way of example, with reference to graphs and schematic representations of the solar cell that can be manufactured according to the invention and with reference to details of apparatus, as shown in the appended drawings, wherein.

To illustrate the condition with regard to the effective distribution coefficients which is stated in claim 1—namely $$\frac{k_{Aeff}(v_n) \cdot k_{Deff}(v_h)}{k_{Aeff}(v_h) \cdot k_{Deff}(v_n)} > 3 \text{ or } < 0.3$$

and, preferably, $$\frac{k_{Aeff}(v_n) \cdot k_{Deff}(v_h)}{k_{Aeff}(v_h) \cdot k_{Deff}(v_n)} > 10 \text{ or } < 0.1$$

Table 3 gives the occurrence of p-n junctions, disregarding other parameters, by way of example for three dopant pairs for various crystal growth rates $v_n$ and $v_h$ which vary periodically about a mean pulling speed of 30 mm/min. (Table 3)

Since the formation of p-n junctions in silicon is dependent not only on the frequency and amplitude of the variation in the crystal growth rate or, rather, in the measures affecting the crystal growth rate, but also—as it has been possible to demonstrate—on the concentrations of acceptors and donors, $C_{iA}$ and $C_{jD}$, in the melt, exemplary concentrations for three dopant pairs and the sequences of p-n junctions arising therefrom will be discussed below with reference to FIGS. 1 to 3. In the graphs, the variation in the crystal growth rate for an amplitude of 27 mm/min and for an amplitude of 10 mm/min at an average pulling speed of 30 mm/min is shown against time on the left.

TABLE 3

Dependence of the occurrence of p-n junctions on the effective distribution coefficients of the dopant pair used.

| dopant pair | $v_n/v_h$ | $\frac{k_{Aeff}(v_n) \cdot k_{Deff}(v_h)}{k_{Aeff}(v_h) \cdot k_{Deff}(v_n)}$ | p-n junctions |
|---|---|---|---|
| B/Sb | 24/36 | $\frac{1 \cdot 1}{1 \cdot 1} = 1.000$ | no |
|  | 12/48 | $\frac{0.98 \cdot 1}{1 \cdot 0.91} = 1.077$ | no |
|  | 6/54 | $\frac{0.97 \cdot 1}{1 \cdot 0.33} = 2.94$ | no |
|  | 3/57 | $\frac{0.91 \cdot 1}{1 \cdot 0.09} = 9.38$ | yes |
| P/Ga | 24/36 | $\frac{0.80 \cdot 1}{1 \cdot 0.99} = 0.8$ | no |
|  | 12/48 | $\frac{0.15 \cdot 1}{1 \cdot 0.9} = 0.16$ | yes |
|  | 6/54 | $\frac{0.036 \cdot 1}{1 \cdot 0.68} = 0.053$ | yes |
|  | 3/57 | $\frac{0.07 \cdot 1}{1 \cdot 0.51} = 0.033$ | yes |
| P/In | 24/36 | $\frac{0.017 \cdot 1}{0.12 \cdot 0.99} = 0.14$ | yes |
|  | 12/48 | $\frac{0.002 \cdot 1}{0.31 \cdot 0.9} = 0.007$ | yes |
|  | 6/54 | $\frac{0.001 \cdot 1}{0.5 \cdot 0.58} = 0.003$ | yes |
|  | 3/57 | $\frac{0.0006 \cdot 1}{0.8 \cdot 0.51} = 0.0015$ | yes |

In the right-hand part of these graphs, the dopant concentrations resulting therefrom for the three different dopant pairs, corresponding to equations 1,3,7 and 8, in the crystallized silicon ribbon are again shown against time.

Figure 1A:
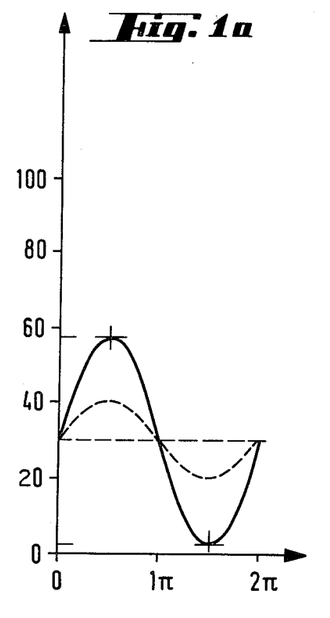
FIG. 1 is a graph of the formation of p-n junctions during growth of the crystal when the dopant pair boron/antimony is added to the silicon melt.
Figure 1B:
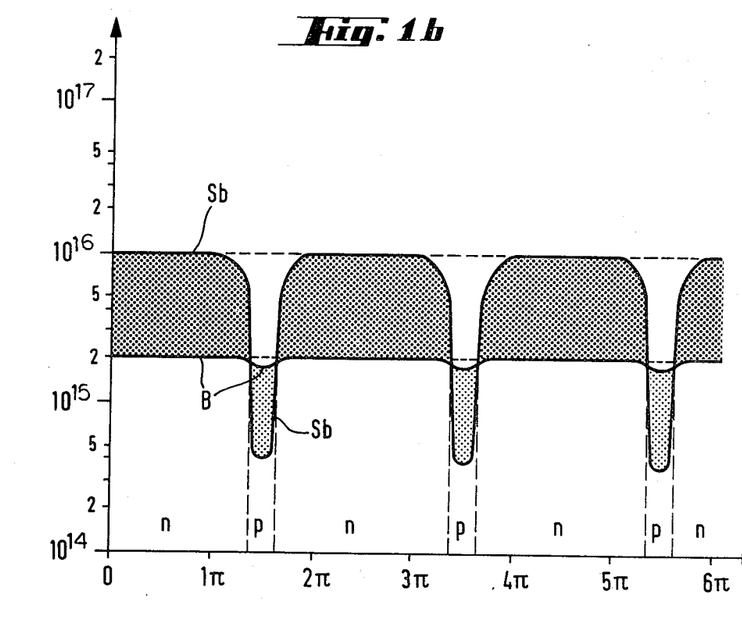

For the dopant pair boron/antimony, with the addition of $10^{16}$ atoms of antimony and $2 \cdot 10^{15}$ atoms of boron per cm$^3$ of silicon melt at a varying crystal growth rate given by $$v = 30 \text{ mm/min} + 27 \text{ mm/min} \cdot \sin 2\pi f_w \cdot t$$

a periodic alternation of positively (p) and negatively (n) conductive zones in the silicon, corresponding to the continuous lines in FIG. 1, is obtained, as can be inferred, by approximation, from Table 2: the effective distribution coefficients of antimony and boron do not deviate from 1 virtually until the crystal growth rate falls below the value of 24 mm/min, that is to say, compensation of the antimony present in the melt in excess relative to boron, with the formation of the p-n junction, and, subsequently, p-conductive silicon does not result until there is a further fall to approximately 5 mm/min since then, in spite of the excess of antimony in the melt, more boron is incorporated until the crystal growth rate has risen above the compensation point again at a crystallization rate that is, however, still less than 24 mm/min (more accurate value can be determined from equation 1).

If, on the other hand, with otherwise identical conditions, the variation in the crystal growth rate is only that given by $$v = 30 \text{ mm/min} + 10 \text{ mm/min} \cdot \sin 2\pi f_w \cdot t$$

then no p-n junctions are produced in the crystal, corresponding to the broken lines in FIG. 1, since the pulling speed falls only to a minimum of 20 mm/min at which the effective distribution coefficient of both antimony and boron still remains at about 1.

Figures 2, 2A, 2B:
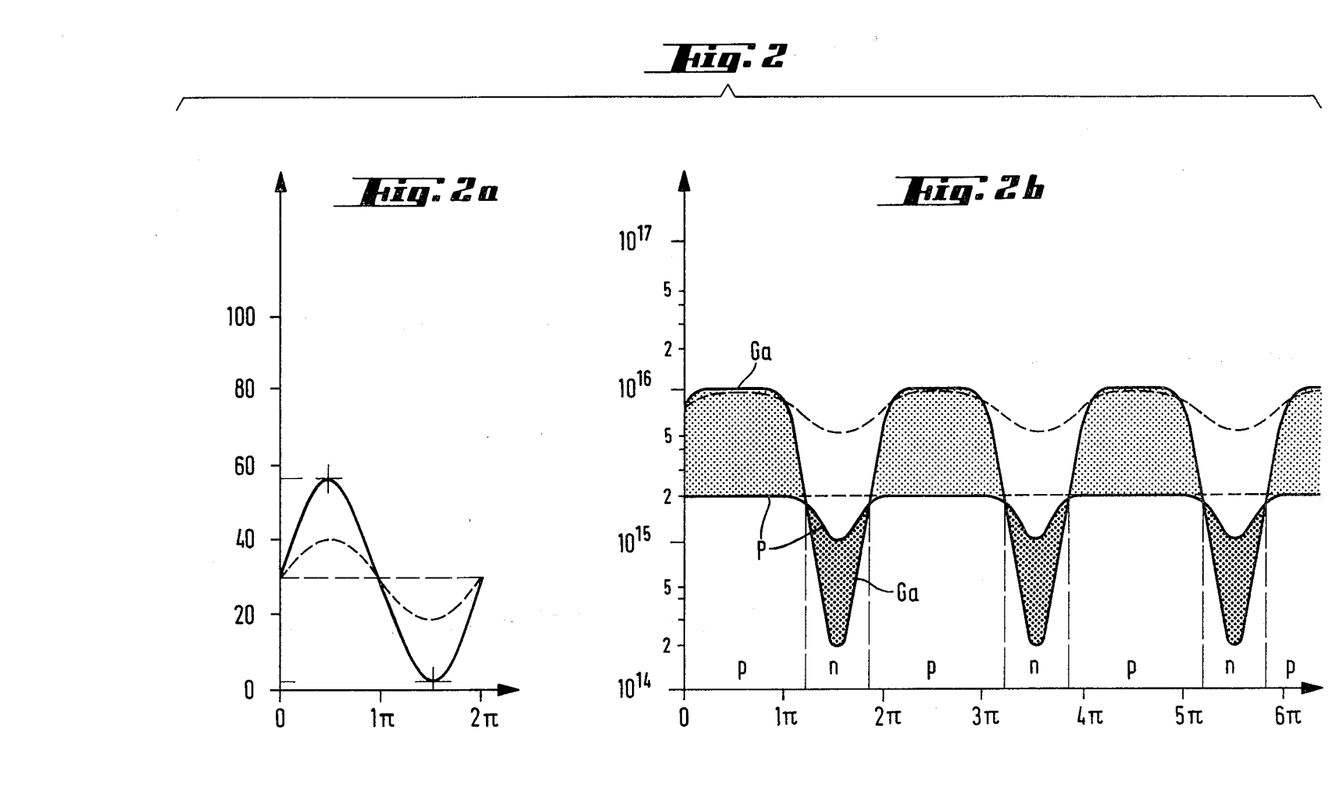
FIG. 2 is a graph of the formation of p-n junctions during growth of the crystal when the dopant pair phosphorus/gallium is added to the silicon melt.

With regard to the dopant pair gallium/phosphorus, with the addition of $10^{16}$ gallium atoms and $2 \cdot 10^{15}$ phosphorus atoms per cm$^3$ of silicon at a varying crystal growth rate given by $$v = 30 \text{ mm/min} + 27 \text{ mm/min} \cdot \sin 2\pi f_w \cdot t$$

a series of p-n junctions, corresponding to the continuous lines in FIG. 2, is obtained in the crystallized silicon.

If, on the other hand, with otherwise identical conditions, the variation of the crystal growth rate is only that given by $$v = 30 \text{ mm/min} + 10 \text{ mm/min} \cdot \sin 2\pi f_w \cdot t$$

then no p-n junctions are produced. Although the effective distribution coefficients for this dopant pair undergo a change when the crystal growth rate falls below 30 mm/min (see Table 2), the deviation is too small for the then increased incorporation of phosphorus to compensate for, let alone exceed, the incorporation of gallium which, owing to the excess of gallium present in the melt, still predominates. The same applies, for example, to the dopant pair gallium/arsenic.

Figure 3A:
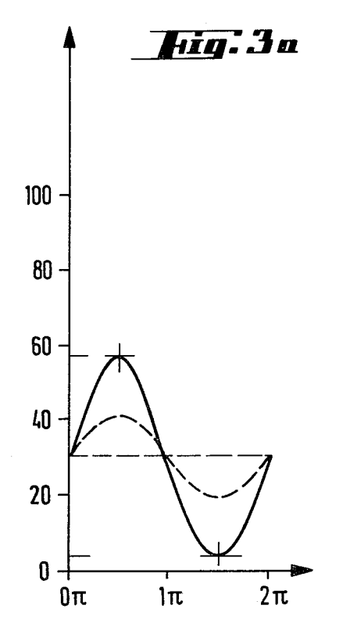
FIG. 3 is a graph of the formation of p-n junctions during growth of the crystal when the dopant pair phosphorus/indium is added to the silicon melt.
Figure 3B:
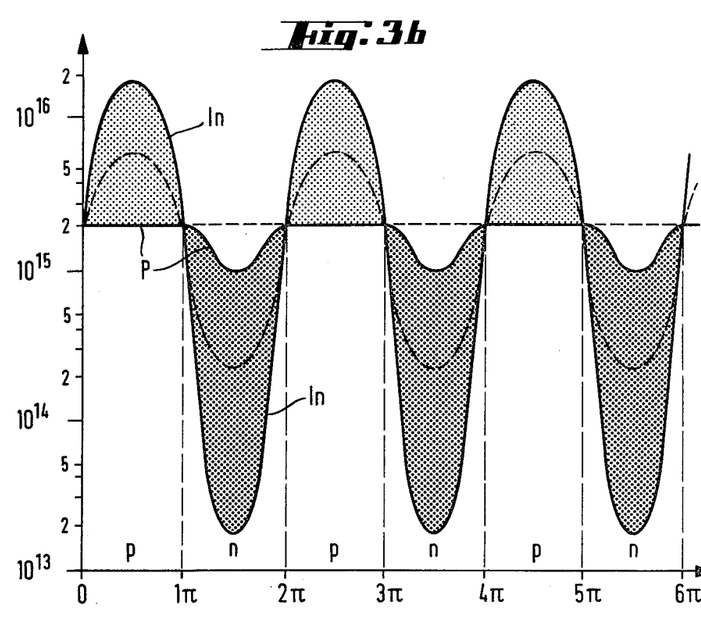

Passing on now to the dopant pair indium/phosphorus, with the addition of $2.5 \cdot 10^{16}$ indium atoms and $2 \cdot 10^{15}$ phosphorus atoms per cm$^3$ of silicon melt, both at a varying crystal growth rate given by $$v = 30 \text{ mm/min} + 27 \text{ mm/min} \cdot \sin 2\pi f_w \cdot t$$

and when the variation is only that given by $$v = 30 \text{ mm/min} + 10 \text{ mm/min} \cdot \sin 2\pi f_w \cdot t$$

p-n junctions are obtained corresponding to the continuous and broken lines in FIG. 3 because, in this case, the effective distribution coefficient of indium immediately changes very greatly upon deviation from the mean pulling speed and from the crystal growth rate of 30 mm/min which this entails. As can be seen from Table 2, the conditions are similar for the dopant pairs indium/arsenic, aluminum/phosphorus and aluminum/arsenic.

Since a high pulling speed is advantageous for the yield of the process, the dopant pairs used are advantageously those having an acceptor of which the distribution coefficient is a rapidly varying function of the crystal growth rate whilst the effective distribution coefficient of the associated donor remains as far as possible constant, or vice versa. In the example of indium/phosphorus described above, vertical p-n junctions can accordingly be obtained, for example, even at a mean pulling speed of 45 mm/min and a variation given by
v=45 mm/min+15 mm/min·sin 2πf$_w$·t If the additions of dopant to the silicon melt are to be measured in weight of dopant per weight of molten silicon rather than in atoms of dopant per cm³ of silicon melt, the following conversion is to be carried out $$W = \frac{C \cdot a}{N \cdot \rho_{Si}} \cdot W_{Si}$$

wherein W and W$_{Si}$ represent the weight of dopant added and of molten silicon, respectively, C represents the concentration of dopant added (C$_{iA}$ or C$_{jD}$) "i" and "j", being integers corresponding to the number of different acceptor and donor dopants, a represents the atomic weight of the dopant N represents Avogadro's number (6.022045×10²³ atoms per gram molecular weight) and ρ$_{Si}$ represents the density of the silicon (2.329 g/cm³).

In principle, it is of course possible to use, according to the invention, also dopant pairs of which one or both dopants consists of more than one constituent.

Applying the teaching according to the invention, it is possible to manufacture silicon wafers having vertical p-n junctions according to all processes for pulling ribbons and polygons, especially according to the forms of those processes known at present which are discussed in the introduction.

Figure 4:
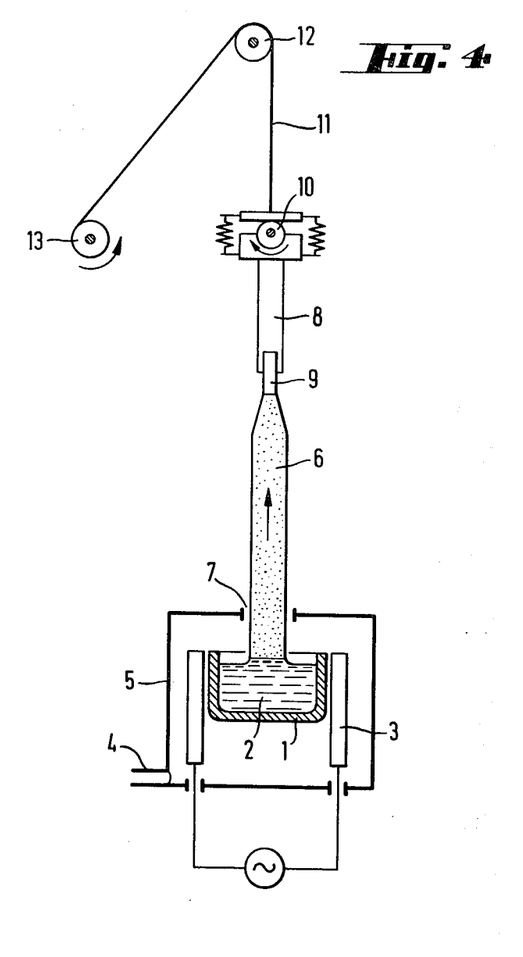
FIG. 4 is a schematic arrangement of a system for discontinuously pulling silicon ribbons having vertical p-n junctions.

To that end, for example, molten silicon 2 and the dopant pair to be used are mixed, in the required concentrations, in a crucible 1 of, for example, quartz, silicon nitride, or graphite coated with silicon nitride and/or silicon carbide in a pulling system such as that shown schematically in FIG. 4. During the pulling operation, the position of the crucible 1 can remain unchanged or, as is sufficiently known from the state of the art, the crucible 1 can be moved slowly upwards by means of a crucible shaft according to the consumption of the melt, so that the free surface of the melt is always at the same height relative to the controllable heating elements 3 which control the temperature of the silicon melt 2. The pulling space, especially in the region of the free surface of the melt, is purged, as usual, with a protective gas during the ribbon-pulling operation, for example by introducing argon through the gas connection 4, to prevent reaction between the silicon melt 2 and atmospheric oxygen. The cover 5 of crucible 1 and heater 3, through which cover the protective gas passes, has in its upper portion a rectangular opening 7 through which the silicon rubber 6 is pulled, the size and shape of the opening 7 being dependent on the dimensions of the silicon ribbon 6 being pulled; the protective gas entering at 4 leaves through the narrow gap formed by the opening 7 in the cover 5 and the silicon rubber 6 and thus prevents the entry of undesired atmospheric oxygen.

To obtain vertical p-n junctions, during pulling, the silicon band 6 which grows on the seed plate 9 fastened to the crystal holder 8 after the seed plate has been immersed is periodically dipped into the melt and removed at a certain frequency by the eccentric 10. The mean pulling speed is achieved by uniformly rolling the steel cable 11 onto the drive roller 13 via the deflecting roller 12.

The length of ribbons pulled in such an apparatus is limited substantially by the distance between the seed plate 9 and the surface of the silicon melt 2 when the crystal holder 8 has been pulled up as far as the deflecting roller 12.

Figure 5:
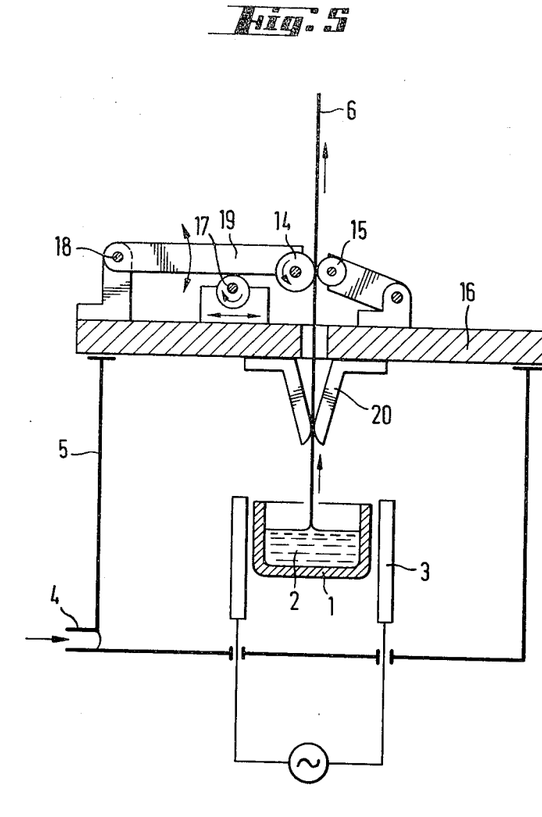
FIG. 5 is a schematic arrangement of a system for continuously pulling silicon ribbons having vertical p-n junctions.

Limitation of the length of the ribbon does not occur in an apparatus such as that shown schematically in FIG. 5. In this embodiment, the silicon ribbon 6 is not pulled from the melt 2 by a steel cable in a finite length but is continuously conveyed out of the melt 2 by means of the drive roller 14 against which the silicon ribbon 6 is pressed by means of a pressure roller 15. The ribbon-pulling operation begins by way of a seed crystal plate which either is long enough to extend from the drive roller 14 into the silicon melt 2 or is simply fastened to the underside of a suitably ribbon-shaped crystal holder and dipped into the melt at the beginning of the ribbon-pulling operation. To set the vertical p-n junctions, there is arranged on the reinforced cover plate 16 of the cover 5 which is purged with protective gas an eccentric block 17 which can be displaced sideways so that any desired periodic change in the lift of the ribbon can be set. The drive roller 14 can be pivoted about the joint 18 so that, when the eccentric 17 is rotating uniformly, a periodic change of the crystal growth occurs. As the eccentric 17 rotates, it uniformly lifts by a certain amount the arm 19 to which the drive roller 14 is fastened, with the result that the mean pulling speed, predetermined by the rotation of the drive roller 14, is increased, and, by virtue of its eccentricity, allows the arm 19 to fall slightly periodically corresponding to a reduced pulling speed.

Since the ribbon is pulled unsupported out of the melt, it is necessary to orient the silicon ribbon by means of a guide 20 made, for example, of quartz. The silicon ribbons can be divided into the desired lengths piece by piece during the pulling operation. The continuous operation of this apparatus is limited only by the given amount of silicon melt. The apparatus can, however, easily be provided with a re-filling connection for adding fresh charges of silicon either in a solid or molten state and also for adding fresh charges of dopants either as such or in the form of pre-doped silicon.

The alteration of the crystal growth rate cannot, of course, be achieved solely by periodically altering the pulling speed but can be achieved especially by periodically altering the temperature in the region of the growth front.

Figure 6:
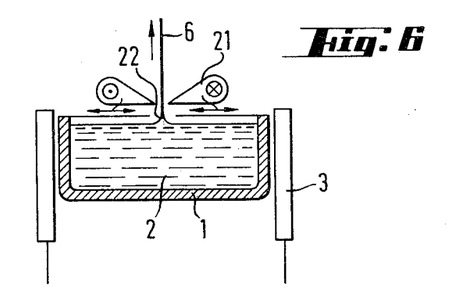
FIG. 6 is a side view of an arrangement of cooling bodies in the region of the growth front.

This can be achieved for example, by additional cooling bodies, as shown in FIG. 6. The cooling plates 21, through which a liquid or gaseous coolant flows, are so arranged that they act directly on the growth front 22. They bring about periodic cooling of the growth front 22 either by a pulsating coolant flow or by a periodic mechanical displacement of the cooling bodies.

Figure 7:
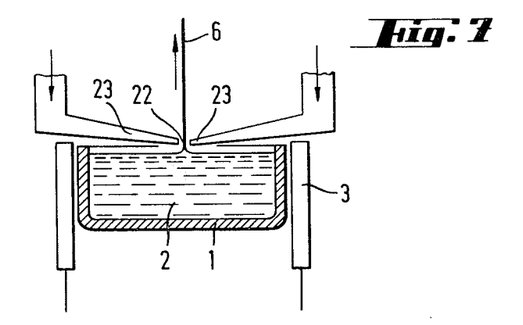
FIG. 7 is a side view of an arrangement of cooling gas nozzles in the region of the growth front.
Figure 8:
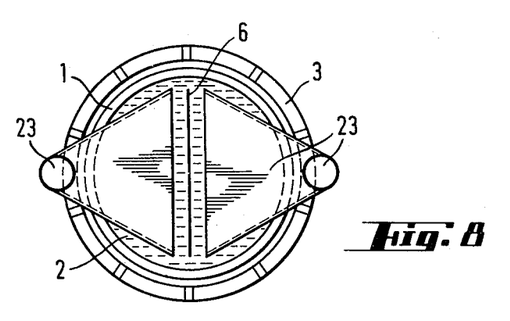
FIG. 8 is a plan view of an arrangement of cooling gas nozzles in the region of the growth front.

As shown in FIGS. 7 and 8, part of the protective gas stream is fed to the growth front 22 not continuously but in pulses, for example by means of a stricture pump, via flat nozzles 23 whereby the crystal growth is likewise influenced in periodic alteration.

Figure 9:
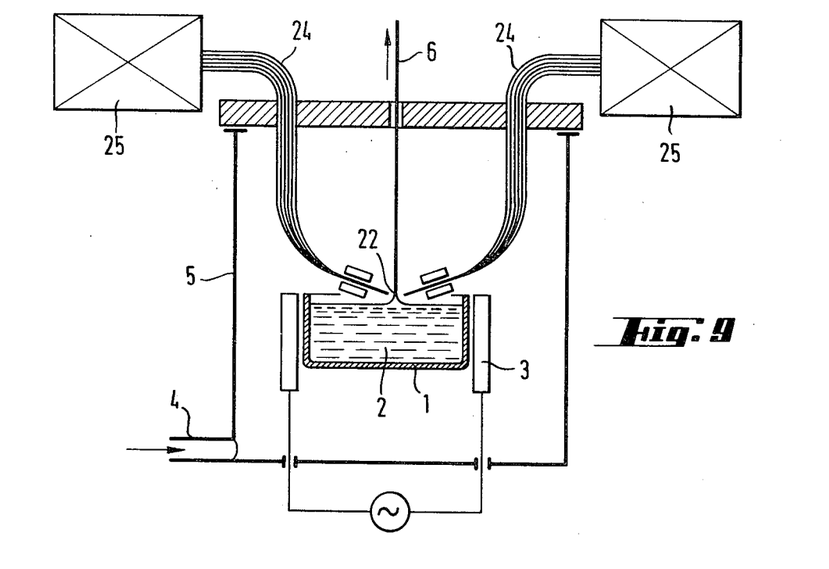
FIG. 9 is a side view of an arrangement of fiber optic light guides in the region of the growth front.
Figure 10:
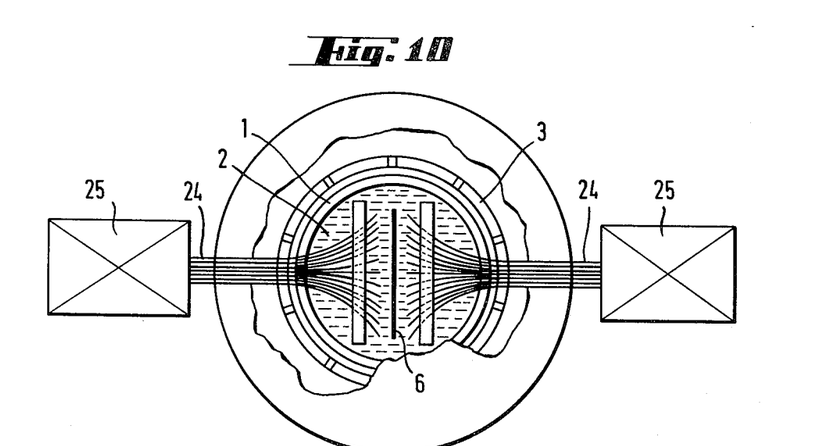
FIG. 10 is a plan view of fiber optic light guides in the region of the growth front.

FIGS. 9 and 10 show additional heating by means of glass fiber bundles. In this case, the glass fiber bundles 24 conduct the heat of periodic light flashes from a light source 25 or a periodically dimmed laser beam to the crystallization front 22 of the silicon ribbon 6 by means of the glass fiber bundles 24 being fanned out in the lower third.

Figure 11:
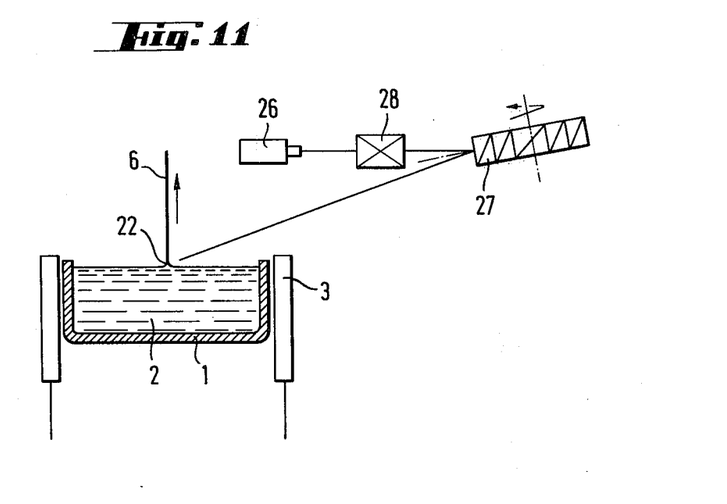
FIG. 11 is a side view showing additional heating in the region of the growth front by means of lasers.
Figure 12:
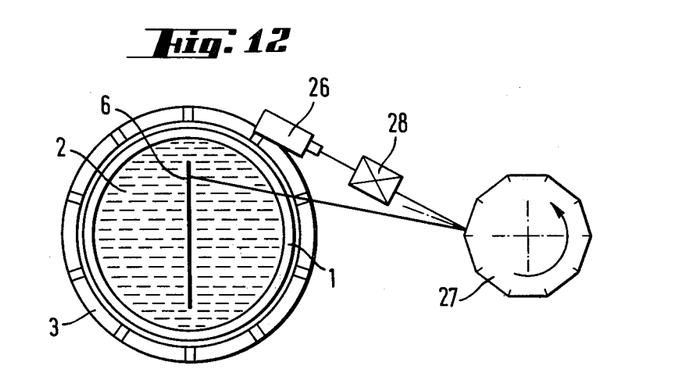
FIG. 12 is a plan view showing additional heating in the region of the growth front by means of lasers.

Influencing of the growth front by laser rays can also be achieved, however, as shown in FIGS. 11 and 12, by so deflecting the laser beam of a laser 26 via a rotating mirror matrix 27 that, after being focused by a lens system 28, it sweeps exactly the crystallization front 22 of the silicon ribbon 6. The crystal growth rate can be periodically altered by periodically interrupting the laser beam.

Figure 13:
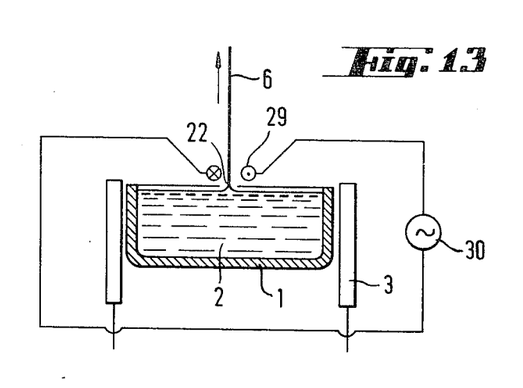
FIG. 13 is a side view showing additional heating by means of graphite filaments.

Another possible method of influencing the crystal growth rate is additional heating by way of graphite filaments as shown in FIG. 13. According to this embodiment, very thin graphite filaments 29 having a diameter of the order of from 0.3 to 3 mm are arranged along the crystal growth front 22 and periodically brought to white heat by an additional heating means 30.

Figure 14:
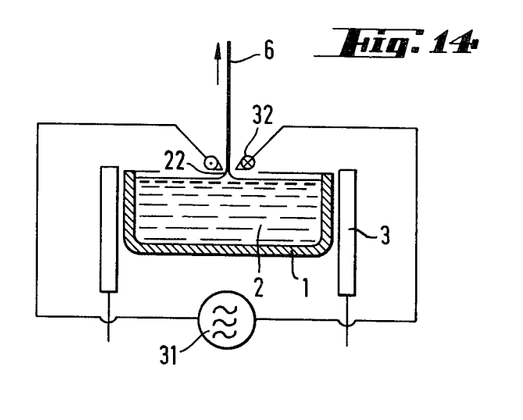
FIG. 14 is a side view showing additional heating by means of a high frequency generator.

FIG. 14 shows a possible method of influencing the crystal growth rate by a high-frequency generator 31. In this case, a high-frequency generator 31 provides periodic inductive heating of the crystallization boundary by means of a coil 32 arranged along the crystallization front 22.

Figure 15:
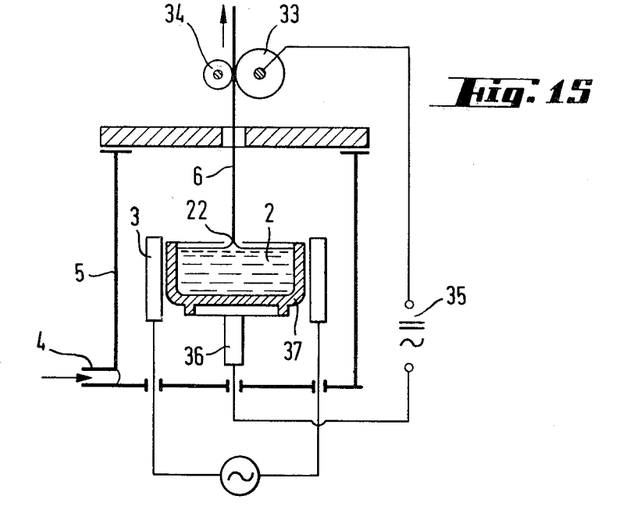
FIG. 15 is a schematic arrangement for influencing the crystal growth rate by means of current pulses.

In addition to the measures already described, the crystal growth rate can also be influenced by current pulses through the crystal growth front 22, as shown in FIG. 15. For this purpose, a contact roller 33 is pressed onto the silicon ribbon 6 by means of a pressure roller 34. This contact roller 33 is connected to one pole of a current source 35. The other pole of the current source is connected via a graphite contact 36 to the graphite crucible 37 and, therewith, to the silicon melt 2. By periodically varying the current flow, corresponding silicon ribbons having vertical p-n junctions can be drawn in this manner from the melt.

Figure 16:
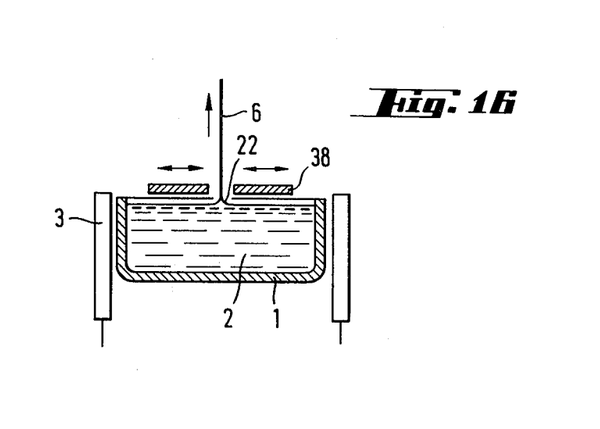
FIG. 16 is a schematic arrangement for influencing the crystal growth rate by means of a radiation screen.

Finally, FIG. 16 shows how the crystal growth front is influenced by radiation screens. Two screening plates 38 are so arranged that a gap is left between them. The silicon ribbon 6 is pulled through that gap. On approximately closing the gap, the crystal growth rate is reduced and, on opening it again, the crystal growth rate increases and, as a result, vertical p-n junctions are formed in the crystallized silicon ribbon 6.

Figure 17:
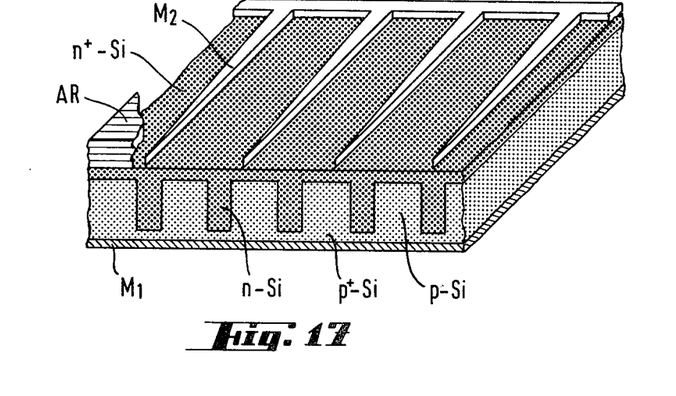
FIG. 17 is a perspective view of a solar cell having pulled, vertical p-n junctions.

For the manufacture of a solar cell, the silicon wafers, manufactured by the process of the invention, that have vertical p-n junctions are also provided, in customary manner, with an n+ layer on one side by incorporating donors by diffusion or ionimplantation and on the opposite side with a p+ layer by incorporating acceptors by diffusion or ionimplantation. For contacting purposes, this is then followed by the customary metallization of the reverse side ($M_1$) and the fitting of a metal grid ($M_2$) on the side facing the light, and also coating with an anti-reflection layer (AR). A resulting solar cell made from a silicon wafer having pulled vertical p-n junctions is shown in FIG. 17.

Example 1

A silicon melt of 345 g containing 9 µg of boron and 300 µg of antimony is placed in an apparatus such as that shown schematically in FIG. 4. A silicon ribbon having the dimensions 0.3×50 mm is drawn upwards out of this melt. The mean pulling speed is 24 mm/min, while the eccentric dips the silicon into the melt and withdraws it at a frequency of 8 Hz. The maximum length of the silicon ribbons, which is determined by the apparatus, is 1.5 m. The length of each p-conductive layer is approximately 10 µm and the length of each n-conductive layer is approximately 40 µm.

Example 2

Figure 18:
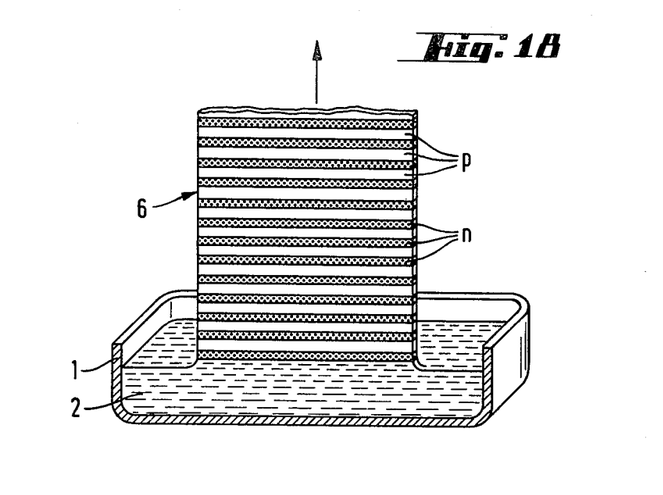
FIG. 18 is a schematic outline of the manufacture of vertical p-n junctions in the pulling of silicon ribbons (and, analogously, silicon polygons and cylinders).

In an apparatus according to FIG. 5, 233 g of silicon consisting of 2.5 Ωcm of phosphorus-doped n-silicon are used and melted together with two indium round blanks each weighing 0.574 mg. The periodic alteration of the crystal growth rate is set by uniformly rotating the eccentric at 480 rev/min. The stroke of the eccentric is 50 µm and was measured at the drive roller 14. Silicon ribbons having the dimensions 0.3×50 mm are pulled, the lengths of the positively-conductive (p) and negatively conductive (n) layers being in each case 25 µm, corresponding to FIG. 18.

The invention can accordingly be applied, of course, to other semiconductors, such as, for example, germanium or III/V compounds, such as gallium arsenide, gallium phosphide and indium phosphide.

While only a few embodiments and examples of the present invention have been shown and described, it is obvious that many changes and modifications may be made thereunto without departing from the spirit and scope of the invention.

What is claimed is:

1. In a process for the manufacture of p-n junctions in the pulling of silicon ribbons, polygons or tubes from a silicon melt, the improvement comprising:
   adding to the silicon melt both dopants that act as acceptors and dopants that act as donors, of which the effective distribution coefficients $k_{Aeff}(v_h)$ and $k_{Deff}(v_h)$ at a high crystal growht rate $v_h$ and the effective distribution coefficients $k_{Aeff}(v_h)$ and $k_{Deff}(v_h)$ at a low crystal growth rate $v_n$ satisfy the condition $$\frac{k_{Aeff}(v_n) \cdot k_{Deff}(v_h)}{k_{Aeff}(v_h) \cdot k_{Deff}(v_h)} > 3 \text{ or } < 0.3$$

wherein, generally, $v_h$ is a crystal growth rate higher than the mean pulling speed and $v_n$ is a crystal growth rate lower than the mean pulling speed;
   pulling silicon from the melt at a mean pulling speed of from 6 to 120 mm/min.; and
   periodically varying the crystal growth rate during the pulling operation between a low rate $v_n$ and a high rate $v_h$ so that the total length of each p- and n-conductive zone in the crystallized silicon is from 5 to 2000 µm.

2. The process according to claim 1, wherein said dopants comprise dopant pairs so selected as to allow a high average pulling speed with a small difference between $v_n$ and $v_h$.

3. The process according to claim 1, wherein said dopant pairs are selected from the group consisting of boron/bismuth, indium/phosphorus, gallium/phosphorus and aluminum/arsenic.

4. The process according to claim 1, wherein said step of varying the crystal growth rate to effect a periodic change from a low growth rate $v_n$ to a high rate $v_h$ comprises periodically varying the pulling speed.

5. The process according to claim 1, wherein said step of varying the crystal growth rate to effect a periodic change from a low growth rate $v_n$ to a high rate $v_h$ comprises periodically varying the temperature of the melt in the region of the growth front.

6. The process according to claim 1, additionally including the step of arranging the total length l of each p- and n-conductive zone in the crystallized silicon so that it is so related to the diffusion length $L_d$ of the minority carriers in silicon for solar cells as to satisfy the condition $0.05 L_d < l < 2 L_d$.

7. The process according to claim 1, wherein the low crystal growth rate $v_n$ is at least 6 mm/min. below the said mean pulling speed and the high crystal growth rate $v_h$ is at least 6 mm/min. above said mean pulling speed.

* * * * *